United States Patent [19]
Tamamura et al.

[11] Patent Number: 5,151,912
[45] Date of Patent: Sep. 29, 1992

[54] SEMICONDUCTOR LASER

[75] Inventors: Koushi Tamamura, Tokyo; Hiroyuki Iwamoto, Kanagawa, both of Japan

[73] Assignee: Sony Corporation, Tokyo, Japan

[21] Appl. No.: 783,787

[22] Filed: Oct. 29, 1991

[30] Foreign Application Priority Data

Nov. 2, 1990 [JP] Japan .................... 2-298166

[51] Int. Cl.⁵ .................................. H01S 3/19
[52] U.S. Cl. ............................ 372/46; 372/45
[58] Field of Search .............. 372/45, 46, 50, 48

[56] References Cited

U.S. PATENT DOCUMENTS 5,040,032 8/1991 Kapon .................... 372/46

Primary Examiner—James W. Davie
Attorney, Agent, or Firm—Hill, Van Santen, Steadman & Simpson

[57] ABSTRACT

A semiconductor laser comprises a semiconductor substrate having first and second surfaces opposing to each other, first and second cladding layers formed on the first surface of the substrate, an active layer of a superlattice structure sandwiched between the first and second cladding layers, a capping layer formed on the second cladding layer, a first electrode provided on the capping layer, and a second electrode connected to the second surface of the substrate. The first surface of the substrate has at least two slanted surfaces whose crystalline planes differ from that of a major surface of the first surface of the substrate, each of the first and second cladding layers and the active layer formed on the substrate has higher carrier density regions above the slanted surfaces, the higher carrier density regions of the active layer are placed in an alloy state, and light is emitted in a region of the active layer which is sandwiched between the alloy regions of the active layer and not placed an an alloy state.

28 Claims, 5 Drawing Sheets

SEMICONDUCTOR LASER

BACKGROUND OF THE INVENTION

1. Field of the Invention

The present invention generally relates to semiconductor lasers and, more particularly, is directed to a compound semiconductor laser having AlGaAs/GaAs etc. based compound semiconductor of the superlattice structure.

2. Description of the Prior Art

In the conventional semiconductor lasers, the gain waveguide function is formed therein in order to lower the threshold current. That is, a current blocking unit for limiting a current is provided to concentrate the current on an oscillation region of an active layer of the laser, thereby forming a portion having a large carrier density, that is, a portion where the gain distribution is increased rapidly. When this type of gain-guided type semiconductor laser is formed, the current is limited by providing a current limiting unit for limiting a current path which is normally formed by selectively forming a high resistance region by the ion implantation process using materials such as proton or boron or by forming a pn junction current cut-off region.

However, according to the above-mentioned methods, the current cannot be concentrated sufficiently so that a threshold current Ith cannot be reduced sufficiently and that the characteristics of the semiconductor laser cannot be stabilized.

In order to perform this current limitation surely with a good reproducibility, the same assignee of the present application has proposed in Japanese Laid-Open Patent Publication No. 63-56981 a compound semiconductor laser constructed in a manner that the current limitation is performed by using a phenomenon that, when the III/V compound such as $Al_xGa_{1-x}As$ group or $In_yGa_{1-y}As$ group ($0 \leq x,y < 1$) is formed by epitaxial growth by the organometalic chemical vapor deposition process, that is, the so-called MOCVD process, the carrier density differs depending on the crystalline plane orientations of the substrate on which the epitaxial growth is performed also when the MOCVD process is performed under the same condition, thereby concentrating the sufficient current on the current limiting portion with a good reproducibility.

Namely, this semiconductor laser is constructed as shown in FIG. 1 that slanted surfaces 12 are formed on a major surface 1A of a substrate 21, e.g., a GaAs single crystal substrate such that a {100} crystal plane and another crystal plane different from the {100} plane are facing on the major surface 1A, and then the III/V group compound semiconductor layer, e.g., a buffer layer 22, a first cladding layer 23, an active layer 24, a second cladding layer 25 and a capping layer 27 are sequentially formed on these crystal planes of the substrate by the epitaxial growth by the MOCVD process, for example. In this configuration, the densities of the epitaxial growth region naturally vary in a range of about $10^{16}$ to $10^{18}$ cm$^{-3}$ and so the carrier densities thereof vary depending on the above-described varieties of the densities, whereby a current concentration region 26 for limiting a current path can be formed by using such a fact that the difference of the electron mobilities, that is, the difference of the resistivities due to the varieties of the carrier densities becomes remarkable. Thus, by using the current concentration region 26 having a resistivity smaller than those of other regions, a region where the current is concentrated in a stripe configuration, that is, a portion having a large gain and a high density of injection carrier can be formed in the active layer 24 positioned at a tip potion of the region 26, thereby making it possible to perform laser illumination.

However, when forming the current concentration region 26 on the two slanted surfaces 12, it has been difficult to surely cross the respective current concentration regions 26 formed on these two slanted surfaces 12 at the active layer 24, and so the characteristics of the laser is likely varied to degrade yield.

On the other hand, since the epitaxial growing apparatuses using the MOCVD process etc. have recently progressed remarkably, the growth of a thin film with a thickness of about a single atomic layer has become possible when growing the compound semiconductor based on AlGaAs/GaAs group etc., so that it has become possible to form a compound semiconductor such that its carrier densities and composition change sharply toward the growing direction for every thickness about a single atomic layer.

By using this technique, there has been tried to form a semiconductor laser whose active layer is constituted by the superlattice structure, for example. In this case, impurities are introduced into both side portions of the active layer to disorder the superlattice (layered structure) into an alloy (bulky structure), namely, an intermixing state, thereby forming regions having a small refractive index at the both side surfaces of the active layer to confine the light of the transverse mode therebetween.

However, when introducing the impurities by the selective diffusion process, it has been difficult to place the region to be an alloy in an intermixing state accurately and so the manufactured semiconductor laser has been poor in reliability.

OBJECTS AND SUMMARY OF THE INVENTION

Accordingly, it is a general object of the present invention to provide an improved semiconductor laser in which the aforementioned shortcomings and the disadvantages of the prior art can be eliminated.

More specifically, it is an object of the present invention to improve the reliability of a buried heterostructure semiconductor laser having the superlattice structure due to the variation of the carrier densities to thereby provide a semiconductor laser with excellent characteristics.

According to an aspect of the present invention, a semiconductor laser comprised of a semiconductor substrate having first and second surfaces opposing to each other, first and second cladding layers formed on the first surface of the substrate, an active layer of a superlattice structure sandwiched between the first and second cladding layers, a capping layer formed on the second cladding layer, a first electrode provided on the capping layer, and a second electrode connected to the second surface of the substrate, wherein the first surface of the substrate has at least two slanted surfaces whose crystalline planes differ from that of a major surface of the first surface of the substrate, each of the first and second cladding layers and the active layer formed on the substrate has a higher carrier density region above the slanted surfaces, the higher carrier density regions of the active layer are placed in an alloy (not layered state such as superlattice structure) state. and light is emitted in a region of the active layer which is sandwiched between the alloy regions of the active layer and not placed in an alloy state.

According to another aspect of the present invention, a semiconductor laser is comprised of a semiconductor substrate having first and second surfaces opposing to each other, first and second cladding layers formed on the first surface of the substrate, an active layer of a superlattice structure sandwiched between the first and second cladding layers, a capping layer formed on the second cladding layer, a first electrode provided on the capping layer, and a second electrode connected to the second surface of the substrate, wherein the first surface of the substrate has at least two projection portions, each of the first and second cladding layers and the active layer formed on the substrate has a higher carrier density region above the projection portions, the higher carrier density regions of the active layer of the superlattice structure are placed in an alloy state, and light is emitted in a region of the active layer which is sandwiched between the alloy regions of the active layer and not placed in an alloy state.

According to still another aspect of the present invention, a semiconductor laser is comprised of a semiconductor substrate having first and second surfaces opposing to each other, first and second cladding layers formed on the first surface of the substrate, an active layer of a quantum well structure sandwiched between the first and second cladding layers, a capping layer formed on the second cladding layer, a first electrode provided on the capping layer, and a second electrode connected to the second surface of the substrate, wherein the first surface of the substrate has at least two slanted surfaces whose crystalline planes differ from that of a major surface of the first surface of the substrate, each of the first and second cladding layers and the active layer formed on the substrate has higher carrier density regions above the slanted surfaces, the higher carrier density regions of the active layer of the quantum well structure are placed in an alloy state, and light is emitted in a region of the active layer which is sandwiched between the alloy regions of the active layer and not placed in an alloy state.

According to a further aspect of the present invention, a semiconductor laser is comprised of a semiconductor substrate having first and second surfaces opposing to each other, first and second cladding layers formed on the first surface of the substrate, an active layer of a quantum well structure sandwiched between the first and second cladding layers, a capping layer formed on the second cladding layer, a first electrode provided on the capping layer, and a second electrode connected to the second surface of the substrate, wherein the first surface of the substrate has at least two projection portions, each of the first and second cladding layers and the active layer formed on the substrate has higher carrier density regions above the projection portions, the higher carrier density regions of the active layer of the quantum well structure are placed in an alloy state, and light is emitted in a region of the active layer which is sandwiched between the alloy regions of the active layer and not placed in an alloy state.

In the semiconductor laser according to the present invention, the active layer of the superlattice structure is placed in the alloy state by utilizing the differences in the carrier densities of an epitaxial growth layer due to the differences in crystalline planes of the compound semiconductor substrate. A high carrier density region for placing the active layer of the superlattice structure in the alloy state can be formed in a manner that a mesa projection or slanted surface is formed on the compound semiconductor substrate and then an epitaxial growth layer is formed thereon, and further the configuration of the high carrier density region can be set with a high accuracy by suitably setting a width and a height of the mesa projection or the slanted surface.

It has been known in the art that the carrier density for placing the superlattice structure region into the alloy state is about $10^{19} \, cm^{-3}$, but actually it is sufficient to be about $3 \times 10^{17}$ to $5 \times 10^{17} \, cm^{-3}$, so that the superlattice structure region can be placed into the alloy state sufficiently by utilizing the differences in the carrier densities of an epitaxial growth layer due to the differences in crystalline planes.

Accordingly, if the mesa projection or slanted surface is formed on the major surface of the compound semiconductor substrate, predetermined portions, that is, particular portions of both sides of the active layer of the superlattice structure are placed in the alloy state during one epitaxial growth by the MOCVD process etc., by utilizing the differences of carrier densities depending on the crystalline plane orientations of the substrate, so that the single crystal regions can be formed surely with a good reproducibility. Therefore, since both side portions of the active layer are placed in the alloy state to decrease the refractive index thereof, the transversal mode light can be reliably confined, thereby providing the compound semiconductor laser having constant characteristics and high reliability.

The above and other objects, features, and advantages of the present invention will become apparent from the following detailed description of illustrative embodiments thereof to be read in conjunction with the accompanying drawings, in which like references are used to identify the same or similar parts in the several views.

DETAILED DESCRIPTION OF THE PREFERRED EMBODIMENTS

The present invention will now be described with reference to the accompanying drawings.

Figure 1:
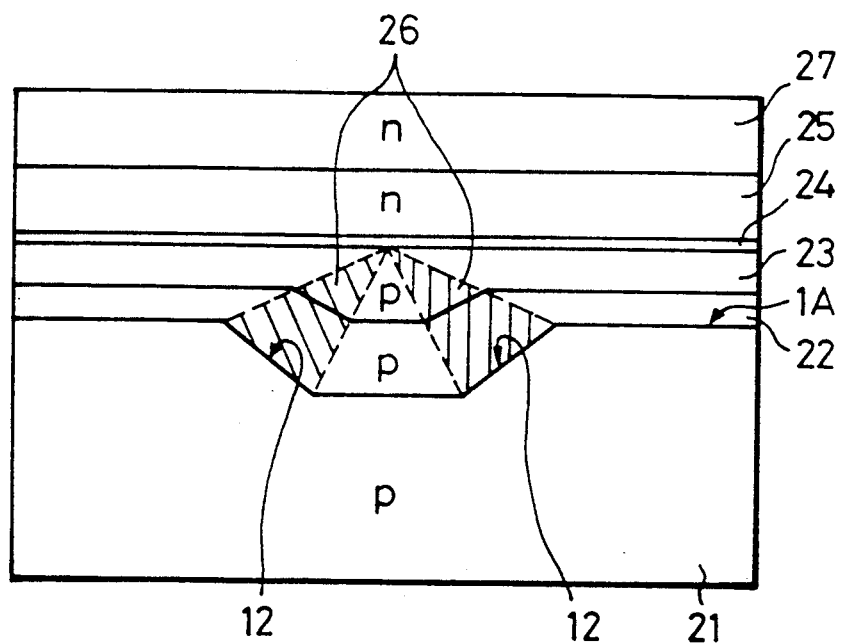
FIG. 1 is an enlarged cross-sectional view of a conventional semiconductor laser.
Figure 2:
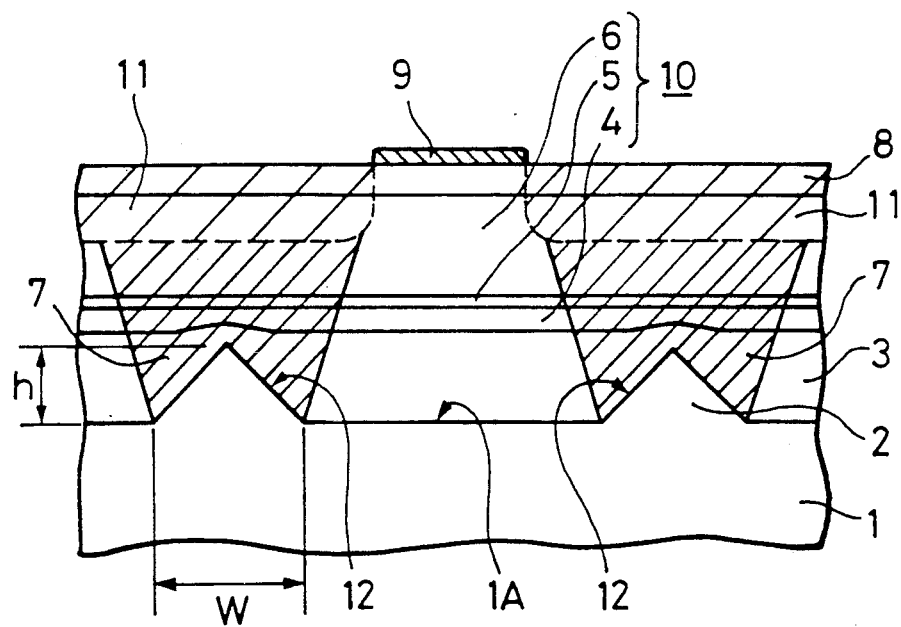
FIG. 2 is a schematic diagram showing a semiconductor laser according to an embodiment of the present invention.
Figure 3A:
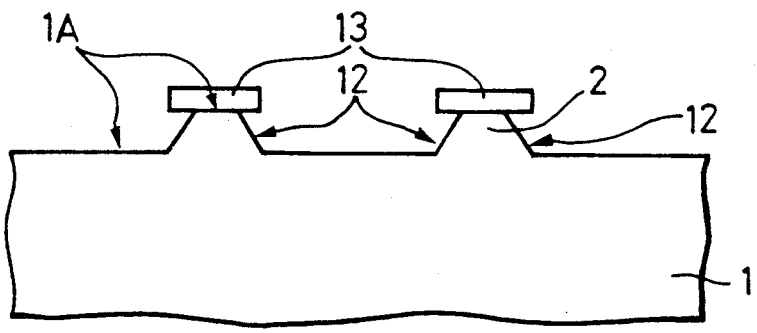
FIGS. 3A to 3C are cross-sectional views illustrating the manufacturing processes of the semiconductor laser according to the embodiment of the present invention, respectively.

In order to facilitate the understanding of the semiconductor laser according to the embodiment of the present invention which is shown in FIG. 2, there will first be described with reference to FIGS. 3A to 3C as to the processes for fabricating an AlGaAs based III/V compound semiconductor laser. Firstly, as shown in FIG. 3A, a compound semiconductor substrate 1, e.g., a GaAs compound semiconductor of a first conductivity type, e.g., n type is provided. The compound semiconductor substrate 1 has a major surface 1A having a (100) plane. On the major surface 1A of the compound semiconductor substrate 1, an etching mask 13 of a strip-like configuration extending in a <011> direction perpendicular to the sheet of drawing forming FIG. 2 is formed by using the photolithography technique, that is, by coating the photoresist, exposing and developing the pattern. Thereafter, an $H_2SO_4$ based wet etching process using the etching mask 13 as a mask is performed in a manner such that part of the substrate 1 which is not covered with the mask 13 is etched away to expose the (100) plane of the major surface 1A thereof and the other part of the substrate 1 beneath the mask 13 is partially etched away to form a mesa projection 2 having a slanted surface 12 made of planes, e.g., (111)B planes.

Figure 3B:
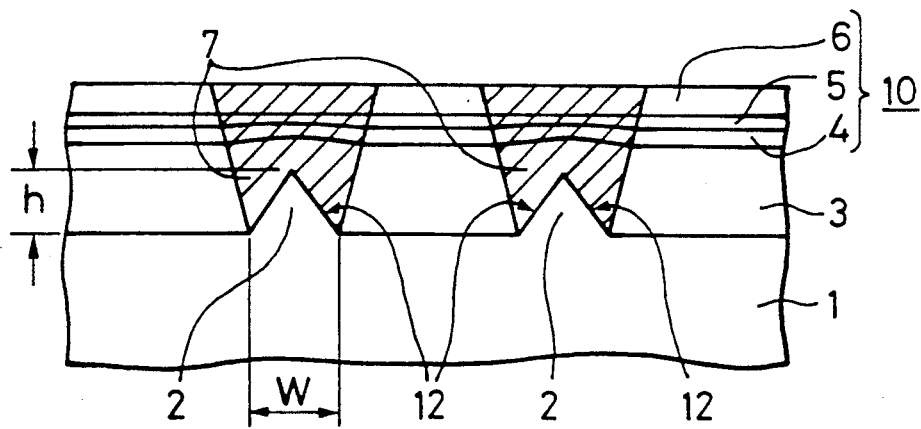

Then, as shown in FIG. 3B, the etching process is continued until the slanted surfaces of the (111) B planes of the mesa projection 2 cross to each other at the top portion thereof, thereby forming the mesa projection 2 having a width w of 2.5 μm and a height h of 1.5 μm, for example. A buffer layer 3 consisting of, for example, an n type $Al_{0.3}Ga_{0.7}As$ layer with a thickness of 0.2 μm and an n type GaAs layer with a thickness of 0.2 μm is grown on an entire surface of the substrate 1 including the mesa projection 2 under the epitaxial growth process by the normal methyl based MOCVD process.

In this case, since the epitaxial growth by the methyl based MOCVD process can be hardly performed on the slanted surfaces 12, that is, the (111)B crystal planes of the mesa projection 2, the buffer layer 3 does not grow at first on the slanted surfaces 12, but the layer 3 grows gradually on the slanted surfaces 12 as the major surface 1A is covered by the layer 3 to finally cover the top portions of the projections 12 to flatten them.

Then, by the methyl based MOCVD process, an n type first cladding layer 4 consisting of the superlattice structure of an AlAs layer with a thickness of 50 Å and a GaAs layer with a thickness of 50 Å is then formed on the buffer layer 3, and further an active layer 5 is formed thereon by repeatedly laminating five times two layers consisting of a layer of a quantum well structure, i.e., a GaAs well layer with a thickness of 80 Å and an $Al_{0.3}Ga_{0.7}As$ barrier layer with a thickness of 120 Å. Furthermore, a p type second cladding layer 6 consisting of an AlAs layer with a thickness of 50 Å and a GaAs layer with a thickness of 50 Å is formed on the active layer 5, thereby forming a compound semiconductor epitaxial growth layer 10 consisting of the n type first cladding layer 4, active layer 5 and p type second cladding layer 6. A high carrier density region 7 is formed at the portion of the epitaxial growth layer 10 corresponding to the slanted surfaces 12, that is, a fan shaped region of the epitaxial growth layer 10 above the mesa projections, so that region of the active layer 5 above the mesa projection 2, that is, particular region of both sides of the active layer 5 is placed in a disorded superlattice state.

Figure 3C:
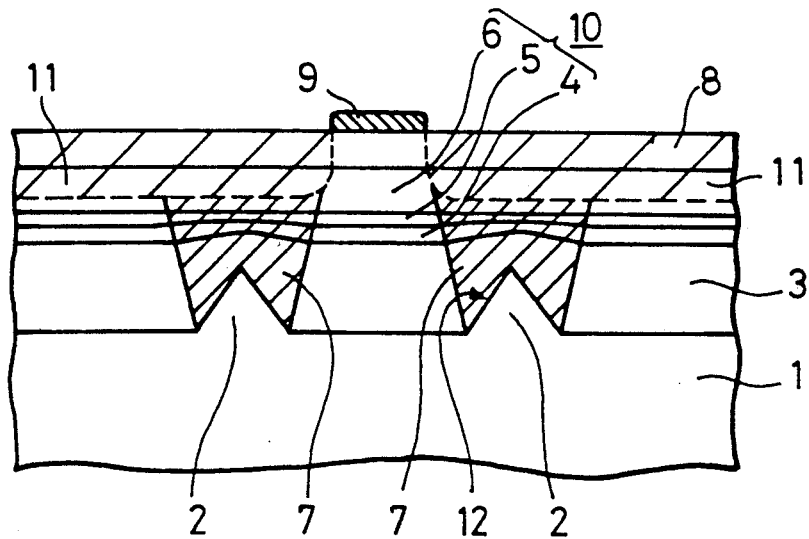

Then, as shown in FIG. 3C, a GaAs capping layer 8 made of a second conductivity type, e.g., p type is formed on the second cladding layer 6 by the MOCVD process, for example. Thereafter, an electrode 9 is formed on a region of the capping layer 8 to be a current path, and furthermore a pregiven mask layer (not shown) is formed thereon. Then, a $B^+$ ion or the like is implanted through the mask layer to form a high resistivity region 11, thereby performing the current limitation more effectively.

Figure 4A:
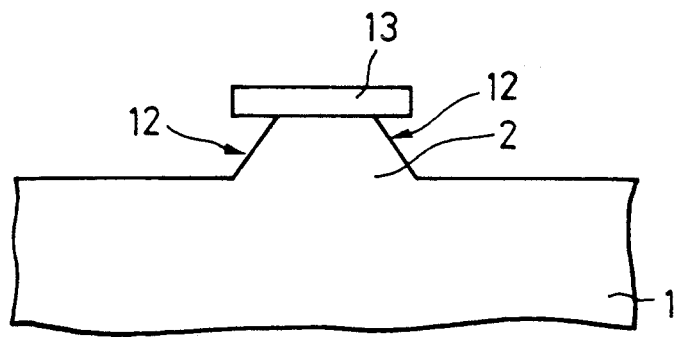
FIGS. 4A and 4B are cross-sectional views illustrating the manufacturing processes of the semiconductor laser according to another embodiment of the present invention, respectively.
Figure 4B:
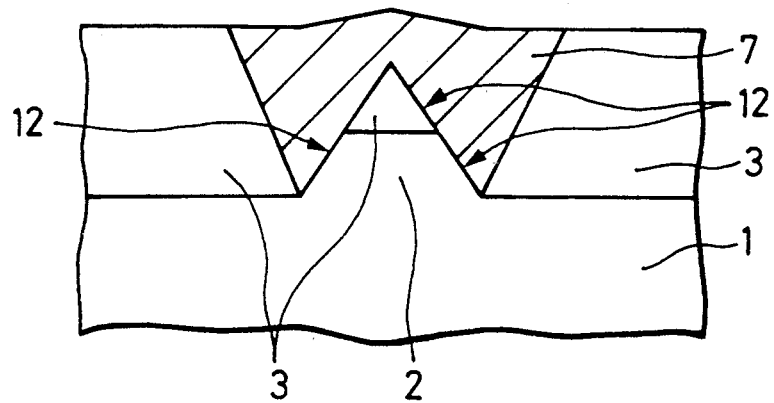

In the above embodiment, the mesa etching process is continued until the slanted surfaces 12 of the mesa projection 2 cross to each other. However, as shown in FIG. 4A, the mesa etching process may be stopped before the slanted surfaces 12 of the mesa projection 2 cross to each other, and then the buffer layer 3 and the first cladding layer 4 etc. may be formed thereon under the epitaxial growth process by the MOCVD process. In this case, as shown in FIG. 4B, in the epitaxial growth process forming the buffer layer 3 etc., the epitaxial growing layer on the mesa projection 2 continues to grow to form the slanted surfaces 12 until the slanted surfaces 12 of the mesa projection 2 cross to each other, thereby forming the high carrier density region 7 on the crossed slanted surfaces 12. Thus, particular regions of both sides of the active layer 5 can be placed in a disordered (superlattice) state surely likewise the above-described embodiment.

In order to place the high carrier density region of the active layer 5 into the disordered (superlattice) state, the active layer is merely required to be the super lattice structure. In this embodiment, the active layer is constituted to be the multiple quantum well structure in order to improve the efficiency of the laser, but the multiple quantum well structure is a kind of the superlattice structure.

The explanation was made of a single laser structure, but the present invention is also applicable to an array type laser having a plurality of illumination portions.

Figure 5:
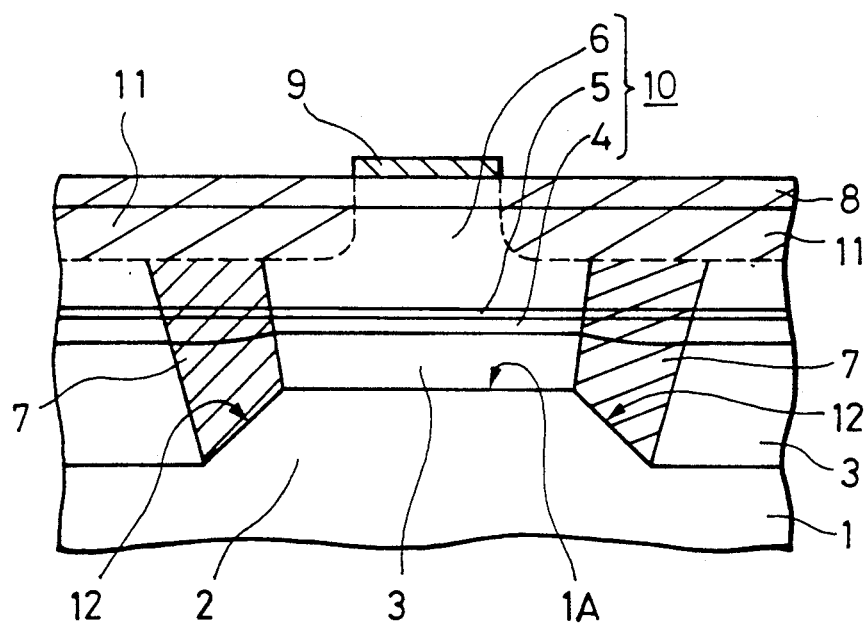
FIG. 5 is an enlarged cross-sectional view illustrating the semiconductor laser according to still another embodiment of the present invention.

FIG. 5 is a cross-sectional view of a semiconductor laser according to still another embodiment of the present invention, wherein a mesa projection 2 of a mesa like configuration having a wider top portion, for example, is formed on a major surface 1A of a compound semiconductor 1, for example, to provide slanted surfaces 12 of (111)B crystal plane at both sides of the mesa projection, and then on each of slanted surfaces 12, a high carrier density region 7 is formed by the epitaxial growth process by the methyl based MOCVD process, thereby placing the high carrier density region of an active layer 5 of the superlattice structure into the disordered (superlattice) state.

In the above described embodiments, the first and second cladding layers 4 and 6 are formed to be the superlattice structure, but each of the layers 4 and 6 may be formed by, for example, an $Al_{0.5}Ga_{0.5}As$ layer with a thickness of 1.5 μm, and the active layer 5 may be formed to be the superlattice structure by repeatedly laminating five times two layers consisting of a GaAs well layer and an $Al_{0.3}Ga_{0.7}As$ barrier layer.

Thus, as described above, according to the semiconductor laser of the present invention, predetermined portions, that is, particular portions of both sides of the active layer of the superlattice structure are placed in the alloy, i.e., disordered (superlattice) state during one epitaxial growth by the MOCVD process etc. by utilizing the differences of carrier densities depending on the crystalline plane orientations of the substrate, so that the alloy regions can be reliably formed with excellent reproducibility.

Further, since both side portions of the active layer are placed in the disordered (superlattice) state to decrease the refractive index thereof, the transversal mode light can be surely confined, thereby providing the semiconductor lasers having constant characteristics and high reliability.

Having described the preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

What is claimed is:

1. A semiconductor laser comprising:
   a semiconductor substrate having first and second surfaces opposing to each other;
   first and second cladding layers formed on the first surface of said substrate;
   an active layer of a superlattice structure sandwiched between said first and second cladding layers;
   a capping layer formed on said second cladding layer;
   a first electrode provided on said capping layer; and
   a second electrode connected to the second surface of said substrate, wherein the first surface of said substrate has at least two slanted surfaces whose crystalline planes differ from that of a major surface of said first surface of said substrate, each of said first and second cladding layers and said active layer formed on said substrate has a higher carrier density region above said slanted surfaces, and the higher carrier density regions of said active layer are placed in an alloy state, and light is emitted in a region of said active layer which is sandwiched between the alloy regions of said active layer and not placed in an alloy state.

2. A semiconductor laser according to claim 1, wherein a carrier density of said higher carrier density regions is in a range of $10^{16}$ to $10^{18}$ /cm$^3$.

3. A semiconductor laser according to claim 1, wherein said active layer is configured as a multiple quantum well layer.

4. A semiconductor laser according to claim 1, wherein a refractive index of the alloy regions of said active layer is smaller than that of regions therebetween from which the light is emitted.

5. A semiconductor laser according to claim 1, further comprising a buffer layer provided between said substrate and said first cladding layer.

6. A semiconductor laser according to claim 1, wherein said major surface of said first surface of said substrate is a (100) plane, and the slanted surfaces extend to a <011> direction and has a (111)B plane.

7. A semiconductor laser according to claim 1, wherein regions of said capping layer provided on the higher carrier density regions above said slanted surfaces have a high resistivity by an ion implantation process.

8. A semiconductor laser comprising:
   a semiconductor substrate having first and second surfaces opposing to each other;
   first and second cladding layers formed on the first surface of said substrate;
   an active layer of a superlattice structure sandwiched between said first and second cladding layers;
   a capping layer formed on said second cladding layer;
   a first electrode provided on said capping layer; and
   a second electrode connected to the second surface of said substrate, wherein the first surface of said substrate has at least two projection portions, each of said first and second cladding layers and said active layer formed on said substrate has a higher carrier density region above said projection portions, and the higher carrier density regions of said active layer of the superlattice structure are placed in an alloy state, and light is emitted in a region of said active layer which is sandwiched between the alloy regions of said active layer and not placed in an alloy state.

9. A semiconductor laser according to claim 8, wherein a carrier density of said higher carrier density regions is in a range of $10^{16}$ to $10^{18}$ /cm$^3$.

10. A semiconductor laser according to claim 8, wherein said active layer is configured as a multiple quantum well layer.

11. A semiconductor laser according to claim 8, wherein a refractive index of the alloy regions of said active layer is smaller than that of regions therebetween from which the light is emitted.

12. A semiconductor laser according to claim 8, further comprising a buffer layer provided between said substrate and said first cladding layer.

13. A semiconductor laser according to claim 8, wherein said first surface of said substrate is a (100) plane, and the projection portion extend to a <011> direction and has a strip like configuration.

14. A semiconductor laser according to claim 8, wherein regions of said capping layer provided on the higher carrier density regions above said projection portions have a high resistivity by an ion implantation process.

15. A semiconductor laser comprising:
   a semiconductor substrate having first and second surfaces opposing to each other;
   first and second cladding layers formed on the first surface of said substrate;
   an active layer of a quantum well structure sandwiched between said first and second cladding layers;
   a capping layer formed on said second cladding layer;
   a first electrode provided on said capping layer; and
   a second electrode connected to the second surface of said substrate, wherein the first surface of said substrate has at least two slanted surfaces whose crystalline planes differ from that of a major surface of said first surface of said substrate, each of said first and second cladding layers and said active layer formed on said substrate has higher carrier density regions above said slanted surfaces, and the higher carrier density regions of said active layer of the quantum well structure are placed in an alloy state, and light is emitted in a region of said active layer which is sandwiched between the alloy regions of said active layer and not placed in an alloy state.

16. A semiconductor laser according to claim 15, wherein a carrier density of said higher carrier density regions is in a range of $10^{16}$ to $10^{18}$ /cm$^3$.

17. A semiconductor laser according to claim 15, wherein said active layer is configured as a multiple quantum well layer.

18. A semiconductor laser according to claim 15, wherein a refractive index of the alloy regions of said active layer is smaller than that of region therebetween from which the light is emitted.

19. A semiconductor laser according to claim 15, further comprising a buffer layer provided between said substrate and said first cladding layer.

20. A semiconductor laser according to claim 15, wherein said major surface of said first surface of said substrate is a (100) plane, and the slanted surface extends to a <011> direction and has a (111)B plane.

21. A semiconductor laser according to claim 15, wherein regions of said capping layer provided on the higher carrier density regions above said slanted surfaces have a high resistivity by an ion implantation process.

22. A semiconductor laser comprising:
a semiconductor substrate having first and second surfaces opposing to each other;
first and second cladding layers formed on the first surface of said substrate;
an active layer of a quantum well structure sandwiched between said first and second cladding layers;
a capping layer formed on said second cladding layer;
a first electrode provided on said capping layer; and
a second electrode connected to the second surface of said substrate, wherein the first surface of said substrate has at least two projection portions, each of said first and second cladding layers and said active layer formed on said substrate has higher carrier density regions above said projection portions, the higher carrier density regions of said active layer of the quantum well structure are placed in an alloy state, and light is emitted in a region of said active layer which is sandwiched between the alloy regions of said active layer and not placed in an alloy state.

23. A semiconductor laser according to claim 22, wherein a carrier density of said higher carrier density regions is in a range of $10^{16}$ to $10^{18}$ /cm$^3$.

24. A semiconductor laser according to claim 22, wherein said active layer is configured as a multiple quantum well layer.

25. A semiconductor laser according to claim 22, wherein a refractive index of the alloy regions of said active layer is smaller than that of regions therebetween from which the light is emitted.

26. A semiconductor laser according to claim 22, further comprising a buffer layer provided between said substrate and said first cladding layer.

27. A semiconductor laser according to claim 22, wherein said first surface of said substrate is a (100) plane, and the projection portion extends to a <011> direction and has a strip like configuration.

28. A semiconductor laser according to claim 22, wherein regions of said capping layer provided on the higher carrier density regions above said projection portions have a high resistivity by an ion implantation process.

* * * * *